US009529023B2

(12) United States Patent
Tu et al.

(10) Patent No.: US 9,529,023 B2
(45) Date of Patent: Dec. 27, 2016

(54) SIGNAL ANALYSIS CIRCUIT AND SIGNAL ANALYSIS METHOD THEREOF

(71) Applicant: ASUSTeK COMPUTER INC., Taipei (TW)

(72) Inventors: Wei-Chen Tu, Taipei (TW); Yi-Ming Huang, Taipei (TW); Ming-Ting Tsai, Taipei (TW); Hsiang-Jui Hung, Taipei (TW)

(73) Assignee: ASUSTeK COMPUTER INC., Taipei (TW)

( * ) Notice: Subject to any disclaimer, the term of this patent is extended or adjusted under 35 U.S.C. 154(b) by 0 days.

(21) Appl. No.: 14/961,905

(22) Filed: Dec. 8, 2015

(65) Prior Publication Data

US 2016/0169943 A1 Jun. 16, 2016

(30) Foreign Application Priority Data

Dec. 16, 2014 (CN) .......................... 2014 1 0781165

(51) Int. Cl.
*H03K 5/153* (2006.01)
*G01R 19/04* (2006.01)

(52) U.S. Cl.
CPC .................................... *G01R 19/04* (2013.01)

(58) Field of Classification Search
CPC ...................................................... G01R 19/04
USPC ......... 327/58–60, 62, 63, 65, 68, 69, 70, 72, 73,327/90
See application file for complete search history.

(56) References Cited

U.S. PATENT DOCUMENTS

| | | | | |
|---|---|---|---|---|
| 4,287,894 A * | 9/1981 | Lautenschlager | ...... | A61B 5/024 327/72 |
| 5,210,397 A * | 5/1993 | Eastman | ............ | G06K 7/10851 235/462.16 |
| 5,594,384 A * | 1/1997 | Carroll | ................. | G06K 7/0008 327/58 |
| 7,570,715 B2 * | 8/2009 | Mizunaga | ............. | H04L 25/061 327/52 |
| 7,738,565 B1 * | 6/2010 | Pogrebinsky | ........ | H03K 5/1532 327/100 |
| 2002/0070763 A1 * | 6/2002 | Yamauchi | ............ | H03K 5/1532 327/58 |

FOREIGN PATENT DOCUMENTS

| | | |
|---|---|---|
| CN | 202422725 U | 9/2012 |
| CN | 102111108 B | 2/2013 |
| CN | 103441743 A | 12/2013 |

* cited by examiner

*Primary Examiner* — Lincoln Donovan
*Assistant Examiner* — Thomas Skibinski
(74) *Attorney, Agent, or Firm* — CKC & Partners Co., Ltd.

(57) ABSTRACT

A signal analysis circuit and a signal analysis method thereof are disclosed. The signal analysis circuit includes a peak detector, a subtraction amplifying unit, and a compare unit. The peak detector obtains a peak value of a first voltage signal to generate a second voltage signal. The subtraction amplifying unit generates a compare voltage signal according to the second voltage signal, and amplifies a voltage value difference between the second voltage signal and the compare voltage signal to generate a third voltage signal. A peak-to-peak value of the third voltage signal is larger than a peak-to-peak value of the second voltage signal. The compare unit compares the voltage value of the third voltage signal and the voltage value of the compare voltage signal to generate an output voltage signal. In such a manner, a new signal analysis circuit can be realized.

10 Claims, 4 Drawing Sheets

SIGNAL ANALYSIS CIRCUIT AND SIGNAL ANALYSIS METHOD THEREOF

RELATED APPLICATIONS

This application claims priority to China Application Serial Number 201410781165.7, filed Dec. 16, 2014, the entirety of which is herein incorporated by reference.

BACKGROUND OF THE INVENTION

Field of the Invention

The disclosure relates to a signal analysis circuit and a signal analysis method thereof.

Description of the Related Art

With the development of the science technology, various signal transmission technologies are widely used in communication devices.

Generally, an electrical transmission line is used to transmit power and signals at the same time to reduce the cost and to save the space occupied by the lines. In the signal transmission technology, the signal analysis circuit analyzes out the signals from the electrical transmission line and provides the signals to a later digital processer. However, the signal analysis circuit is very complex to cause much space occupied to result in a high manufacture cost.

BRIEF SUMMARY OF THE INVENTION

According to a first aspect of the present disclosure. A signal analysis circuit, comprises a peak detector configured to receive a first voltage signal and obtain a peak value of the first voltage signal to generate a second voltage signal; a subtraction amplifying unit configured to generate a compare voltage signal according to the second voltage signal, and amplifying a voltage value difference between the second voltage signal and the compare voltage signal to generate a third voltage signal, wherein a peak-to-peak value of the third voltage signal is larger than a peak-to-peak value of the second voltage signal; and a compare unit electrically connected to the subtraction amplifying unit and configured to compare a voltage value of the third voltage signal and a voltage value of the compare voltage signal to generate an output voltage signal.

Furthermore, according to a second aspect of the present disclosure. The signal analysis method includes following steps: obtaining a peak value of a first voltage signal by a peak detector to generate a second voltage signal; generating a compare voltage signal according to the second voltage signal; amplifying a voltage value difference between the second voltage signal and the compare voltage signal to generate a third voltage signal, wherein a peak-to-peak value of the third voltage signal is larger than a peak-to-peak value of the second voltage signal; and comparing a voltage value of the third voltage signal and a voltage value of the compare voltage signal to generate an output voltage signal.

DETAILED DESCRIPTION OF THE EMBODIMENTS

Figure 1:
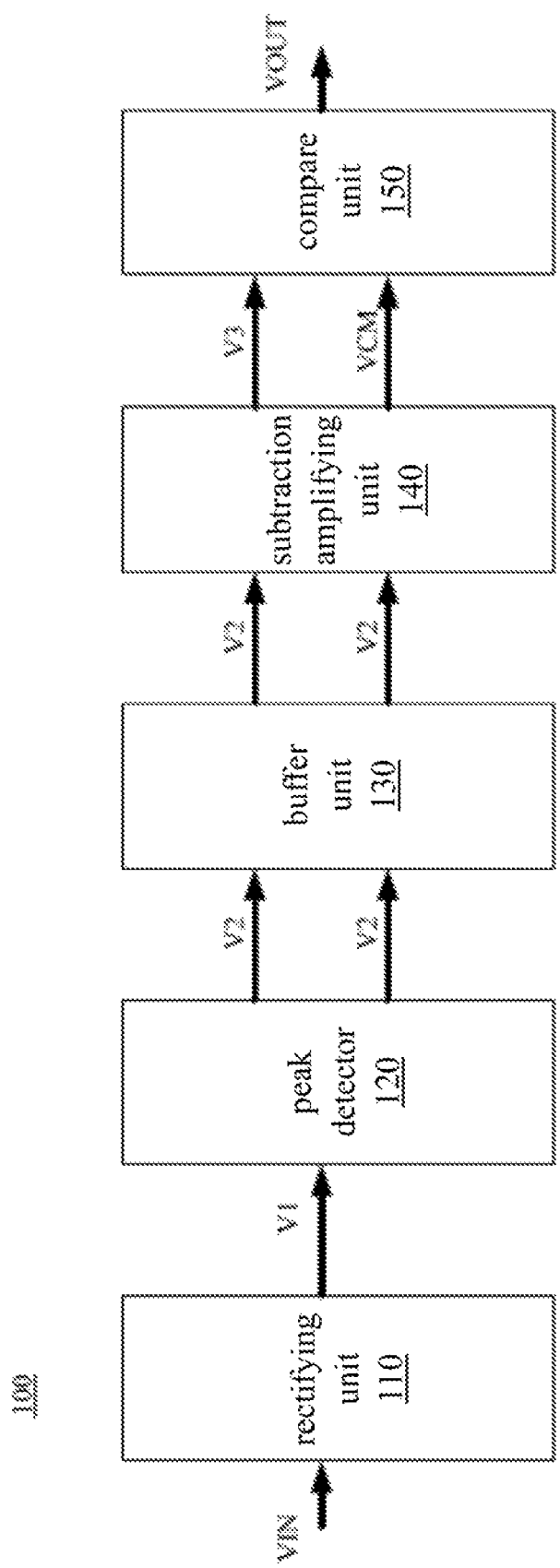
FIG. 1 is a schematic diagram showing a signal analysis circuit in an embodiment.
Figure 2:
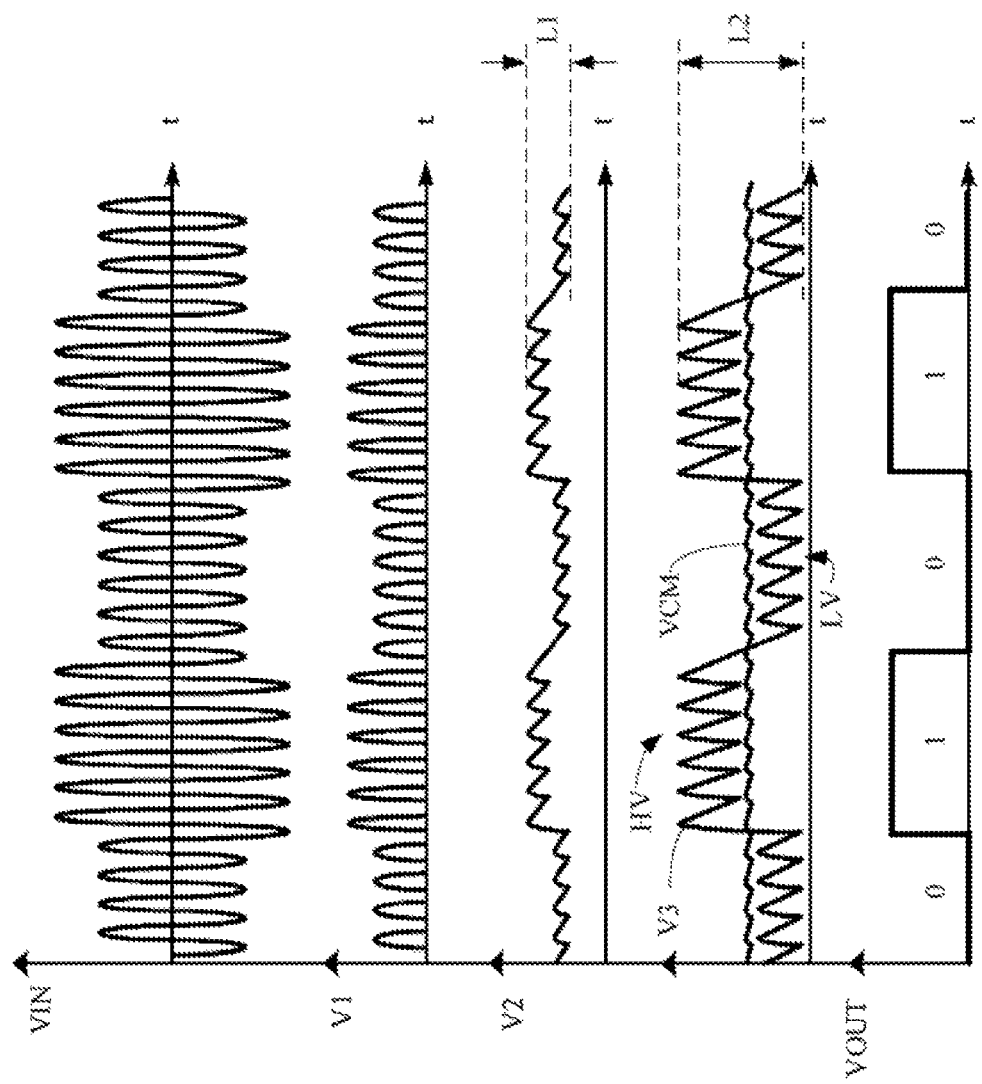
FIG. 2 is a schematic diagram showing voltages of a signal analysis circuit in an embodiment.

Please refer to FIG. 1 and FIG. 2. FIG. 1 is a schematic diagram showing a signal analysis circuit 100 in an embodiment, and FIG. 2 is a schematic diagram showing voltages of a signal analysis circuit 100 in an embodiment. In the embodiment, the signal analysis circuit 100 includes a rectifying unit 110, a peak detector 120, a buffer unit 130, a subtraction amplifying unit 140 and a compare unit 150. In the embodiment, the rectifying unit 110 is electrically connected to the peak detector 320. The buffer unit 130 is electrically connected between the peak detector 120 and the subtraction amplifying unit 140. The subtraction amplifying unit 140 is electrically connected to the compare unit 150.

In an embodiment, the rectifying unit 110 receives an input signal VIN, and executes the voltage division and the half wave rectification on the input signal VIN to generate the first voltage signal V1. In the embodiment, the input signal VIN is an alternating current (AC) signal with binary signals for a high frequency wave signal with low frequency square wave signals as shown in FIG. 2), which is not limited herein. In other embodiments, the input signal VIN is a square wave signal. In an embodiment, the rectifying unit 110 is omitted.

In the embodiment, the peak detector 120 receives the first voltage signal V1, detects and obtains a peak value of the first voltage signal V1 to generate the second voltage signal V2.

In the embodiment, the buffer unit 130 isolates the subtraction amplifying unit 140 and the peak detector 120 to avoid a load effect on the peak detector 120 from the subtraction amplifying unit 140. In an embodiment, the buffer unit 130 is omitted.

In the embodiment, the subtraction amplifying unit 140 receives the second voltage signal V2, generates the compare voltage signal VCM according to the second voltage signal V2, and amplifies the voltage value difference between the second voltage signal V2 and the compare voltage signal VCM to generate the third voltage signal V3.

In an embodiment, the subtraction amplifying unit 140 executes the low pass filtering to the second voltage signal V2 to generate the compare voltage signal VCM. The difference between the high voltage level part HV and the low voltage level part LV of the third voltage signal V3 becomes larger by amplifying the voltage value difference between the second voltage signal V2 and the compare voltage signal VCM, which benefits the subsequent analysis.

In an embodiment, the peak-to-peak value L2 of the third voltage signal V3 is larger than the peak-to-peak value L1 of the second voltage signal V2.

In the embodiment, the compare unit 150 receives the third voltage signal V3 and the compare voltage signal VCM, and compares the voltage value of the third voltage signal V3 and that of the compare voltage signal VCM to generate the output voltage signal VOUT. In an embodiment, the output voltage signal VOUT is a square wave signal. When the voltage value of the compare voltage signal VCM is larger than that of the third voltage signal V3, the output voltage signal VOUT has a low voltage level, and when the compare voltage signal VCM is smaller than the third voltage signal V3, the output voltage signal VOUT has a high voltage level.

As stated above, the input signal VIN is converted to the output voltage signal VOUT in square waveforms, and the subsequent digital processor operates according to the output voltage signal VOUT.

Figure 3:
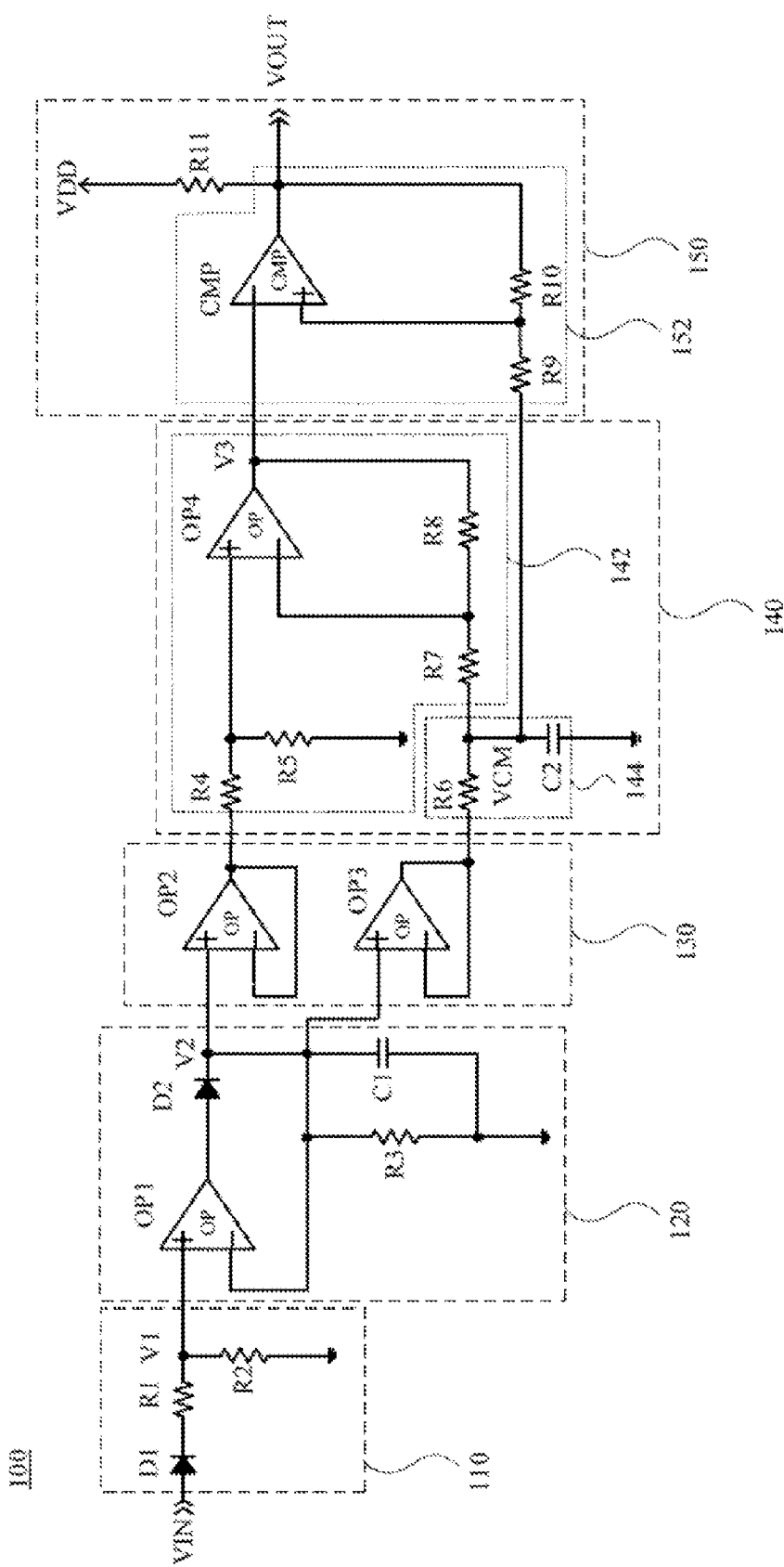
FIG. 3 is a schematic diagram showing details of a signal analysis circuit in an embodiments.

FIG. 3 is a schematic diagram showing details of the signal analysis circuit 100 in an embodiment.

In the embodiment, the rectifying unit 110 includes a diode D1 and the resistors R1 and R2. The anode of the diode D1 receives the input signal VIN. The cathode of the diode D1 is electrically connected to one end of the resistor R1. The other end of the resistor R1 is electrically connected to the node with the first voltage signal V1, and connected to the ground via the resistor R2.

The rectifying unit 110 rectifies the input signal VIN via the diode D1, and the rectifying unit 110 divides the voltage of the input signal VIN via the resistors R1 and R2 to generate the first voltage signal V1.

In the embodiment, the peak detector 120 includes the operation amplifier OP1, the diode D2, the resistor R3 and the capacitor C1. The first input end of the operation amplifier OP1 receives the first voltage signal V1, the second input end of the operation amplifier OP1 is electrically connected to the node with the second voltage signal V2. The output end of the operation amplifier OP1 is electrically connected to the anode of the diode D2. The cathode of the diode D2 is electrically connected to the node with the second voltage signal V2. The capacitor C1 is electrically connected between the node with the second voltage signal V2 and the ground. The resistor R3 is electrically connected between the node with the second voltage signal V2 and the ground, and the resistor R3 is electrically connected to the capacitor C1 in parallel. The peak detector 120 obtains the peak value of the first voltage signal V1 via the capacitor C1 to generate the second voltage signal V2.

In the embodiment, the buffer unit 130 includes the operation amplifiers OP2 and OP3. Both the operation amplifiers OP2 and OP3 are follower amplifiers. The operation amplifiers OP2 and OP3 are electrically connected between the node with the second voltage signal V2 and the subtraction amplifying unit 140 to avoid a load effect on the peak detector 120 from the subtraction amplifying unit 140. In an embodiment, the follower amplifier of the operation amplifier OP2 is omitted.

In the embodiment, the subtraction amplifying unit 140 includes the subtraction amplifier 142 and the low-pass filter 144. The first input end of the subtraction amplifier 142 is electrically connected to the output end of the operation amplifier OP2 to receive the second voltage signal V2. The second input end of the subtraction amplifier 142 is electrically connected to the node with the compare voltage signal VCM to receive the compare voltage signal VCM. The output end of the subtraction amplifier 142 is electrically connected to the node with the third voltage signal V3. The input end of the low-pass filter 144 receives the second voltage signal V2, and the output end of the low-pass filter 144 outputs the compare voltage signal VCM. The low-pass filter 144 executes the low pass filtering on the second voltage signal V2 to generate the compare voltage signal VCM.

In the embodiment, the low-pass filter 144 includes the resistor R6 and the capacitor C2. The resistor R6 is electrically connected between the output end of the operation amplifier OP3 and the node of the compare voltage signal VCM. The capacitor C2 is electrically connected between the node with the compare voltage signal VCM and the around.

In the embodiment, the subtraction amplifier 142 includes the operation amplifier OP4 and the resistors R4, R5, R7 and R8. One end of the resistor R4 is electrically connected to the output end of the operation amplifier OP2, and the other end of the resistor R4 is connected to the ground via the resistor R5 and electrically connected to the first input end of the operation amplifier OP4. The resistor R7 is electrically connected between the node with the compare voltage signal VCM and the second input end of the operation amplifier OP4. The resistor R8 is electrically connected between the second input end of the operation amplifier OP4 and the output end.

The subtraction amplifying unit 140 generates the compare voltage signal VCM via the low-pass filter 144. Thus, the subtraction amplifying unit 140 amplifies the voltage value difference between the compare voltage signal VCM and the second voltage signal V2 via the subtraction amplifier 142 to generate the third voltage signal V3.

In the embodiment, the compare unit 150 includes the hysteresis comparator 152 and the resistor R11. The first input end of the hysteresis comparator 152 receives the third voltage signal V3, the second input end of the hysteresis comparator 152 receives the compare voltage signal VCM, and the output end of the hysteresis comparator 152 is electrically connected to the node with the output voltage signal VOUT. The resistor R11 is electrically connected between a power source with the voltage level VDD and the node with the output voltage signal VOUT.

In detail, the hysteresis comparator 152 includes the comparator CMP and the resistors R9 and R10. The first input end of the comparator CMP receives the third voltage signal V3, and the second input end of the comparator CMP is electrically connected to the node with the compare voltage signal VCM via the resistor R9, and the second input end of the comparator CMP is electrically connected between the output end of the comparator CMP and the node with the output voltage signal VOUT via the resistor R10.

The compare unit 150 compares the voltage value of the third voltage signal V3 and the voltage value of the compare voltage signal VCM via the hysteresis comparator 152, and a square wave whose amplitude is the voltage level VDD is generated as the output voltage signal VOUT according to a compare result.

In the embodiment, the resistors R9 and R10 are omitted, and the compare unit 150 uses the comparator CMP to compare the voltage values of the third voltage signal V3 and the compare voltage signal VCM.

In an embodiment, the resistance of the resistor R1 is 2 kΩ, the resistance of the resistor R2 is 1 kΩ, the resistance of the resistor R3 is 150 kΩ, the resistance of the resistor R4 is 10 kΩ, the resistance of the resistor R5 is 100 kΩ, the resistance of the resistor R6 is 1 kΩ, the resistance of the resistor R7 is 10 kΩ, the resistance of the resistor R8 is 100 kΩ, the resistance of the resistor R9 is 100 kΩ, the resistance of the resistor R10 is 100 kΩ, and the resistance of the resistor R11 is 10 kΩ. The capacitance of the capacitor C1 is 47 μF, and the capacitance of the capacitor C2 is 22 μF. The values are not limited herein.

In an embodiment, the amplifiers OP1 to OP4 are integrated to one chip, which is not limited herein.

The signal analysis circuit 100 is achieved via simple components to convert the input signal VIN to the output voltage signal VOUT, and the subsequent digital processor operates according to the output voltage signal VOUT.

Figure 4:
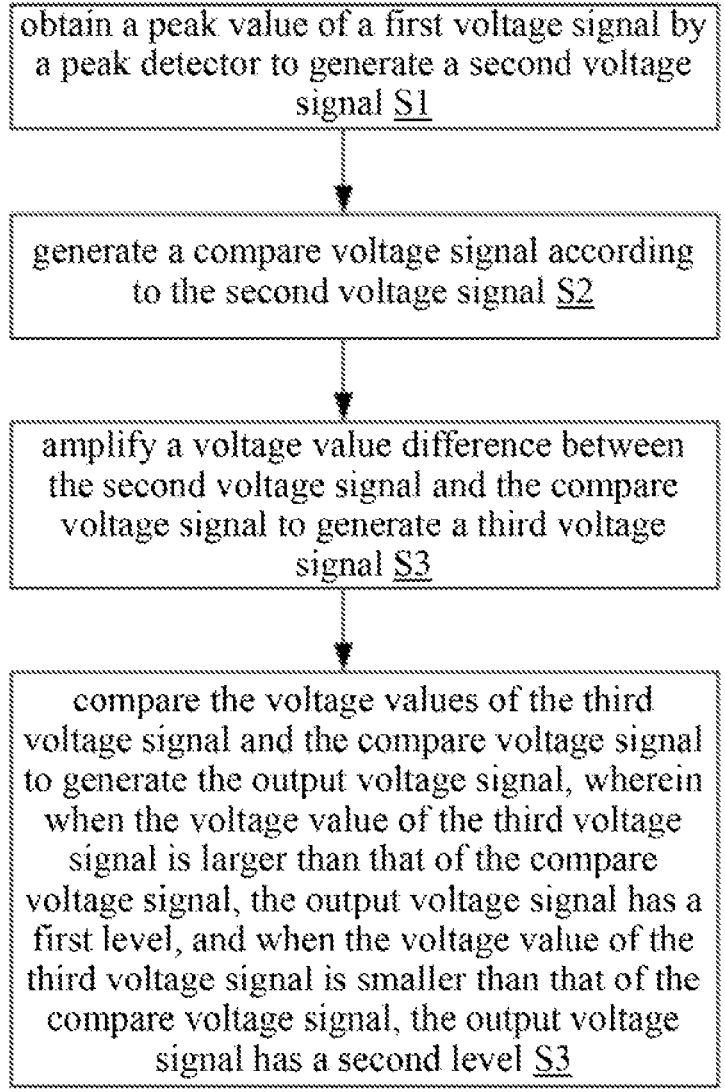
FIG. 4 is a flow chart showing a signal analysis method in an embodiment.

FIG. 4 is a flow chart showing, a signal analysis method 200 in an embodiment. The signal analysis method 200 is applied to the signal analysis circuit 100 in FIG. 1, which is not limited herein. The signal analysis method 200 is illustrated with FIG. 1 in the following. The steps of the signal analysis method 200 do not have a specific sequence unless expressly stated. The steps can be executed at the same time, or the steps have overlaps on the operation time.

In the embodiment, the signal analysis method 200 includes following steps, which is not limited herein.

In the step S1, the peak detector 120 obtains the peak value of the first voltage signal V1 generate the second voltage signal V2.

In the step S2, the subtraction amplifying unit 140 generates the compare voltage signal VCM according to the second voltage signal V2.

In the step S3, the subtraction amplifying unit 140 amplifies the voltage value difference between the second voltage signal V2 and the compare voltage signal VCM to generate the third voltage signal V3.

In the step S4, the compare unit 150 compares the voltage values of the third voltage signal V3 and the compare voltage signal VCM to generate the output voltage signal VOUT. In an embodiment, when the voltage value of the third voltage signal V3 is larger than that of the compare voltage signal VCM, the output voltage signal VOUT has a first level and when the voltage value of the third voltage signal V3 is smaller than that of the compare voltage signal VCM, the output voltage signal VCM has a second level. The second level is lower than the first level.

The details of the signal analysis method 200 can refer to the previous embodiments, which is omitted herein.

A signal analysis circuit is achieved to convert the first voltage signal to the output voltage signal, and the subsequent digital processor operates according the output voltage signal.

What is claimed is:

1. A signal analysis circuit, comprising:
   a peak detector configured to receive a first voltage signal and obtain a peak value of the first voltage signal to generate a second voltage signal;
   a subtraction amplifying unit configured to generate a compare voltage signal according to the second voltage signal, and amplifying a voltage value difference between the second voltage signal and the compare voltage signal to generate a third voltage signal, wherein a peak-to-peak value of the third voltage signal is larger than a peak-to-peak value of the second voltage signal; and
   a compare unit electrically connected to the subtraction amplifying unit and configured to compare a voltage value of the third voltage signal and a voltage value of the compare voltage signal to generate an output voltage signal.

2. The signal analysis circuit according to claim 1, wherein the signal analysis circuit includes:
   a rectifying unit configured to receive an input signal and rectifying the input signal to generate the first voltage signal.

3. The signal analysis circuit according to claim 1, wherein the peak detector includes:
   an operation amplifier including a first input end of the operation, amplifier configured to receive the first voltage signal, an output end of the operation amplifier configured to output the second voltage signal, and a second input end of the operation amplifier electrically connected to the output end;
   a capacitor electrically connected to the second input end of the operation amplifier; and
   a resistor electrically connected to the capacitor.

4. The signal analysis circuit according to claim 3, wherein the peak detector includes:
   a diode electrically connected between the output end of the operation amplifier and a node with the second voltage signal.

5. The signal analysis circuit according to claim 1, wherein the signal analysis circuit includes:
   a buffer unit electrically connected between the peak detector and the subtraction amplifying unit.

6. The signal analysis circuit according to claim 1, wherein the subtraction amplifying unit includes:
   a subtraction amplifier including a first input end of the subtraction amplifier configured to receive the second voltage signal, a second input end of the subtraction amplifier configured to receive the compare voltage signal, and an output end of the subtraction amplifier configured to output the third voltage signal.

7. The signal analysis circuit according to claim 6, wherein the subtraction amplifying unit includes:
   a low-pass filter configured to filter the second voltage signal to generate the compare voltage signal.

8. The signal analysis circuit according to claim 6, wherein the compare unit includes:
   a hysteresis comparator including a first input end of the hysteresis comparator electrically connected to the output end of the subtraction amplifier, a second input end of the hysteresis comparator electrically connected to the second input end of the subtraction amplifier, and an output end of the subtraction amplifier configured to output the output voltage signal.

9. A signal analysis method, comprising following steps:
   obtaining a peak value of a first voltage signal by a peak detector to generate a second voltage signal;
   generating a compare voltage signal according to the second voltage signal;
   amplifying a voltage value difference between the second voltage signal and the compare voltage signal to generate a third voltage signal, wherein a peak-to-peak value of the third voltage signal is larger than a peak-to-peak value of the second voltage signal; and
   comparing a voltage value of the third voltage signal and a voltage value of the compare voltage signal to generate an output voltage signal.

10. The signal analysis method according to claim 9, wherein the step of comparing the voltage value of the third voltage signal and the voltage value of the compare voltage signal to generate the output voltage signal includes that:
    the output voltage signal is at a first level when the voltage value of the third of voltage signal is larger than the voltage value of the compare voltage signal; and
    the output voltage signal is at a second level when the voltage value of the third voltage signal is smaller than the voltage value of the compare voltage signal, wherein the second level is lower than the first level.

* * * * *